United States Patent
Bush et al.

(10) Patent No.: US 6,380,554 B1
(45) Date of Patent: Apr. 30, 2002

(54) TEST STRUCTURE FOR ELECTRICALLY MEASURING THE DEGREE OF MISALIGNMENT BETWEEN SUCCESSIVE LAYERS OF CONDUCTORS

(75) Inventors: John J. Bush, Leander; H. Jim Fulford, Jr., Austin; Mark I. Gardner, Cedar Creek, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/093,358

(22) Filed: Jun. 8, 1998

(51) Int. Cl.[7] .............................................. H01L 23/58
(52) U.S. Cl. ........................................ 257/48; 257/758
(58) Field of Search ..................... 257/48, 758; 438/11, 438/13, 14

(56) References Cited

U.S. PATENT DOCUMENTS

| | | | |
|---|---|---|---|
| 3,751,647 A | 8/1973 | Maeder et al. | |
| 3,842,491 A | 10/1974 | Depuy et al. | |
| 4,347,479 A | * 8/1982 | Cullet | ......................... 324/64 |
| 4,386,459 A | * 6/1983 | Boulin | ......................... 29/574 |
| 5,553,274 A | 9/1996 | Liebmann | |
| 5,705,301 A | 1/1998 | Garza et al. | |
| 5,707,765 A | 1/1998 | Chen | |
| 5,723,233 A | 3/1998 | Garza et al. | |
| 5,773,315 A | 6/1998 | Jarvis | |
| 5,916,715 A | * 6/1999 | Fulford, Jr. et al. | .......... 430/22 |

OTHER PUBLICATIONS

Dieter K. Schroder, "Semiconductor Material and Device Characterization", Library of Congress Cataloging in Publication Data, pp. 120–123, 1990.*

Schroder, *Semiconductor Material and Device Characterization*, 1990, pp. 121–123.

* cited by examiner

Primary Examiner—Phat X. Cao
(74) *Attorney, Agent, or Firm*—Kevin L. Daffer; Conley, Rose & Tayon P.C.

(57) ABSTRACT

The present invention advantageously provides a test structure and method for using electrical measurements to determine the overlay between successive layers of conductors lithographically patterned upon a semiconductor topography. According to an embodiment, a test structure is provided which includes first, second, and third conductive structures having first, second, and third corner regions, respectively. Alternatively, the conductive structures may include only a single conductive structure having three corner regions. Each corner region is bounded by a pair of outer lateral edges configured substantially perpendicular to one another. First, second, and third conductors are operably coupled to the first, second, and third corner regions, respectively, such that overlapping areas of the conductors arranged directly above the corner regions are substantially rectangular in shape. The layout design for the test structure specifies the targeted dimensions, x and y, of each overlapping area. Fabrication of the test structure may result in the overlapping areas being shifted from their targeted positions such that their dimensions are larger or smaller than their targeted values. The amount by which the overlapping areas are shifted in the x direction is known as $\Delta x$, and the amount by which the overlapping areas are shifted in the y direction is known as $\Delta y$. The contact resistances between the overlapping areas of the conductors and the corner regions may be found and substituted into equations for $\Delta x$ and $\Delta y$.

12 Claims, 4 Drawing Sheets

TEST STRUCTURE FOR ELECTRICALLY MEASURING THE DEGREE OF MISALIGNMENT BETWEEN SUCCESSIVE LAYERS OF CONDUCTORS

BACKGROUND OF THE INVENTION

1. Field of the Invention

This invention relates to integrated circuit fabrication and, more particularly, to a test structure from which electrical measurements may be taken to determine overlay, or the degree of misalignment between successive layers of conductors in the integrated circuit.

2. Description of the Related Art

Fabrication of an integrated circuit involves numerous processing steps. After impurity regions (e.g., source/drain regions) have been placed within a silicon-based substrate and gate areas defined upon the substrate, an interlevel dielectric is formed across the topography to isolate the gate areas and the impurity regions. Interconnect routing is then placed across the semiconductor topography and connected to the impurity regions and/or the gate areas by ohmic contacts formed through the interlevel dielectric. The entire process of making ohmic contacts to the impurity regions and/or the gate areas and routing interconnect material between the ohmic contacts is described generally as "metallization". As the complexity of integrated circuits has increased, the complexity of the metallization composition has also increased. Conductive materials other than metal are commonly used for metallization. As such, the term metallization is generic in its application.

A local interconnect is a special form of interconnect used to connect structures which are spaced a relatively short distance apart. FIG. 1 depicts a partial top plan view of an exemplary integrated circuit employing a local interconnect. A pair of transistors 10 and 12 are arranged a lateral spaced distance apart upon and within a semiconductor substrate. Transistors 10 and 12 comprise respective gate conductors 14 and 16 interposed between respective source/drain regions 18 and 20. Those source/drain regions 18 and 20 are arranged within the substrate and are isolated from each other by field isolation regions. A local interconnect 22 extends across the substrate from gate conductor 14 of transistor 10 to one source/drain region 20 of transistor 16. The local interconnect 22 is oriented such that it does not pass over source/drain regions 18 and cause unwanted shorting between gate conductor 14 and source/drain regions 18. Using a local interconnect to couple a gate of one transistor to a source/drain region of another transistor is prevalent in, for example, high density VLSI logic and SRAMs. Local interconnects, when covered with a dielectric, permit "global" interconnect to extend in an unrestricted manner a dielectric-spaced distance over the local interconnects.

Global interconnects and local interconnects are typically formed above a semiconductor topography by one of two methods. In the so-called damascene process, the conductive material from which an interconnect is made is deposited into a trench which has been etched into an interlevel dielectric. Alternatively, the conductive material may be deposited across an interlevel dielectric, and select portions of the conductive material may be etched away to define the interconnect. Whatever the method used to form a local interconnect, a technique known as "lithography" is generally used to define the regions of the interlevel dielectric or conductive material to be etched. Lithography entails transferring an optical image to a photosensitive film from a patterned mask plate (i.e., reticle) placed in proximity to the film. The photosensitive film, i.e., "photoresist" has two main properties. First, solubility of the resist changes in response to it being exposed to appropriate radiation. Second, a hardened resist is resistant to attack by an etchant capable of removing selectively exposed conductive and/or dielectric material.

The mask plate is patterned such that it includes both transparent and opaque regions. Patterns upon the mask plate are projected onto the resist using various forms of radiation. Ultraviolet light is the primary form of radiation that is used, but x-rays and electron beams are growing in popularity. The radiation is transmitted through only the transparent portions of the mask plate to the resist. The resist solubility of regions that are exposed to radiation is altered by a photochemical reaction. A solvent may be used to remove the resist areas of higher solubility. If the resist is a positive resist, the resist areas exposed to radiation are removed. On the other hand, if the resist is a negative resist, the unexposed resist areas are removed while the exposed areas are retained. Once the resist is patterned, regions of the conductive material or dielectric not covered by the resist are etched. Finally, the resist is removed, leaving a duplicate of the mask plate pattern etched into the substrate film.

During lithography, it is necessary that the mask plate pattern be properly aligned relative to previously formed features in the topography. Typically, alignment is performed using a structure known as an "alignment mark". The alignment mark includes an alignment target that is formed in a layer of the topography. An alignment guide formed within the mask plate can then be visually or optically aligned with the alignment mark. Alignment is achieved by moving the mask plate until the alignment guide and the alignment target are correctly positioned with respect to each other. Perfect alignment of the patterned topography to the desired image to be printed is rarely achieved.

Proper lithographic alignment is necessary to avoid failure of devices employed by an integrated circuit. For instance, if local interconnect 22 in FIG. 1 is patterned such that it is shifted to the right of its targeted position, it may inadvertently couple gate conductor 14 to gate conductor 16. In the extreme, lithographic misalignment may lead to shorting between structures that should be isolated from each other and isolation of structures that should be coupled to each other. Even if the extreme scenario does not occur, the contact resistance between successive layers of conductors may be increased if they are slightly misaligned. Consequently, devices may receive less voltage or current than desired.

To ensure that a lithographic system is performing accurate alignment during fabrication, the overlay, i.e., the degree of misalignment between successive layers of patterns formed in a semiconductor topography, may be measured. Generally, a test structure comprising features, such as successive layers of conductors, is formed upon a wafer, along with other test structures and/or with functioning integrated circuit devices. The distances between the features of the test structure are measured to determine the extent by which the features are shifted from their desired or targeted locations. Such measurements are often performed using an optical measurement system such as a scanning electron microscope ("SEM"). Unfortunately, taking those types of measurements are often time consuming. Further, accuracy of measurements made using an optical measurement system may be limited by the resolution of the system or ability of the system to distinguish closely spaced objects.

It would therefore be of benefit to develop a test structure and method which would provide for more rapid and accurate determination of the overlay between successive layers of conductors. That is, it would be desirable if the method used to find the overlay does not rely on measurements taken using an optical measurement system. Such a test structure and method would prove beneficial in possibly locating the source of misalignment, and would therefore allow for corrective measures to be taken to prevent future misalignment problems. To be a viable test structure, it is desired that it not only quantify misalignment, but also indicate the direction of misalignment. Quantifying the amount and direction of misalignment provides indicia to an operator necessary for him or her to adjust for the misalignment on future wafer runs.

SUMMARY OF THE INVENTION

The problems outlined above are in large part solved by the test structure and method hereof in which electrical measurements are used to determine the overlay between successive layers of conductors. In particular, the contact resistances between conductors and a conductive structure (or conductive structures) may be measured to determine misalignment in both the x and y directions. Electrical measurements at particular locations on the test structure may be taken to determine the contact resistances. Advantageously, accurate electrical measurements may be taken quickly and with ease. Once the contact resistances have been determined, they may be substituted into equations for determining the misalignment in the x and y directions. Knowing the amount and direction of misalignment, measures can be taken to correct the lithographic equipment so that better alignment between successive layers of patterns can be achieved in the future.

According to an embodiment, a test structure is provided which includes first, second, and third conductive structures having first, second, and third corner regions, respectively. The conductive structures are laterally isolated from each other by a dielectric. Each corner region is bounded by a pair of outer lateral edges configured substantially perpendicular to one another. First, second, and third conductors are operably coupled to the first, second, and third corner regions, respectively, such that overlapping areas of the conductors arranged directly above the corner regions are substantially rectangular in shape. The layout design for the test structure specifies the targeted dimensions, x and y, of each overlapping area. Fabrication of the test structure may result in the overlapping areas being shifted from their targeted positions such that their dimensions are larger or smaller than their targeted values. The amount by which the overlapping areas are shifted in the x direction is known as Δx, and the amount by which the overlapping areas are shifted in the y direction is known as Δy.

The conductors and the conductive structures may comprise a semiconductive material, such as polysilicon, or a metal, such as tungsten. The conductors may be local interconnects which directly abut the corner regions of the conductive structures. Alternatively, the conductors may be spaced above the conductive structure, and contacts may extend vertically between the corner regions and the overlapping areas. The contacts are sufficiently large to ensure that they completely overlap the corner regions of the conductive structure, even if misaligned. Each conductor includes a pair of arms configured substantially perpendicular to each other. The arms of each conductor extend laterally from the overlapping area to respective conductive pads. Electrical signals may be applied to and received from the conductive pads.

Each conductive structure includes a first member configured substantially perpendicular to a second member. Conductive lines may be operably coupled to each of the members to aid in the measuring of the contact resistances of the conductors relative to the conductive structures. Contacts may extend vertically between the conductive lines and respective members of each conductive structure. Probe pads to which electrical signals may be applied, and from which electrical signals may be received, are positioned in contact with the ends of the conductive structures.

In an alternate embodiment, the test structure includes only one conductive structure in the shape of a substantially rectangular shaped loop. The loop includes four members and four corner regions, each of which are laterally bounded by a pair of perpendicular lateral edges. First, second, and third conductors are operably coupled to respective first, second, and third corner regions of the test structure. The conductors include rectangular shaped overlapping areas that are arranged directly above the corner regions of the conductive structure. Each conductor includes two arms configured substantially perpendicular to each other and connected to conductive pads. The test structure also comprises conductive lines operably coupled to each member of the conductive structure. Each conductive line is connected to a probe pad.

The contact resistance between each conductor and the corner region of the underlying conductive structure is measured electrically. The x-direction misalignment may then be found using the following equation:

$$\Delta x = \frac{x(R_3 - R_1)}{R_1 + R_3}$$

and the y-direction misalignment may be found using the following equation:

$$\Delta y = \frac{y(R_1 - R_2)}{R_1 + R_2}$$

wherein $R_1$, $R_2$, and $R_3$ are the contact resistances between the first, second, and third conductors and the first, second, and third corner regions, respectively.

The contact resistance between one of the conductors and the underlying conductive structure may be determined by forcing a current to flow between a first arm of the conductor and a first member of the conductive structure which is arranged parallel to and in close proximity to the arm. A current is applied to the conductive pad coupled to the first arm while the probe pad connected to the first member is grounded in order to cause current to flow therebetween. A high-impedance voltmeter may be used to measure the voltage difference between the conductive pad in contact with the second arm of the conductor and the probe pad coupled to a second member of the conductive structure. The second member is arranged parallel to the second arm. Using a high impedance voltmeter for this measurement allows very little current flow between the second arm of the conductor and the second member of the conductive structure. Therefore, it may be assumed that the voltage difference is due solely to the voltage drop across the conductor/conductive structure interface, and thus may be used to determine contact resistance. This is probably a more accurate assumption for the embodiment in which the test structure includes three separate conductive structures than for the embodiment in which the test structure includes one test structure. That is, the current applied to the first arm may flow around the rectangular shaped loop of the single conductive structure to the grounded first member. As a result, current is allowed to undesirably flow between the second arm and the second member. The contact resistances for the first, second, and third conductors may be found in this manner.

BRIEF DESCRIPTION OF THE DRAWINGS

Other objects and advantages of the invention will become apparent upon reading the following detailed description and upon reference to the accompanying drawings in which.

Figure 1:
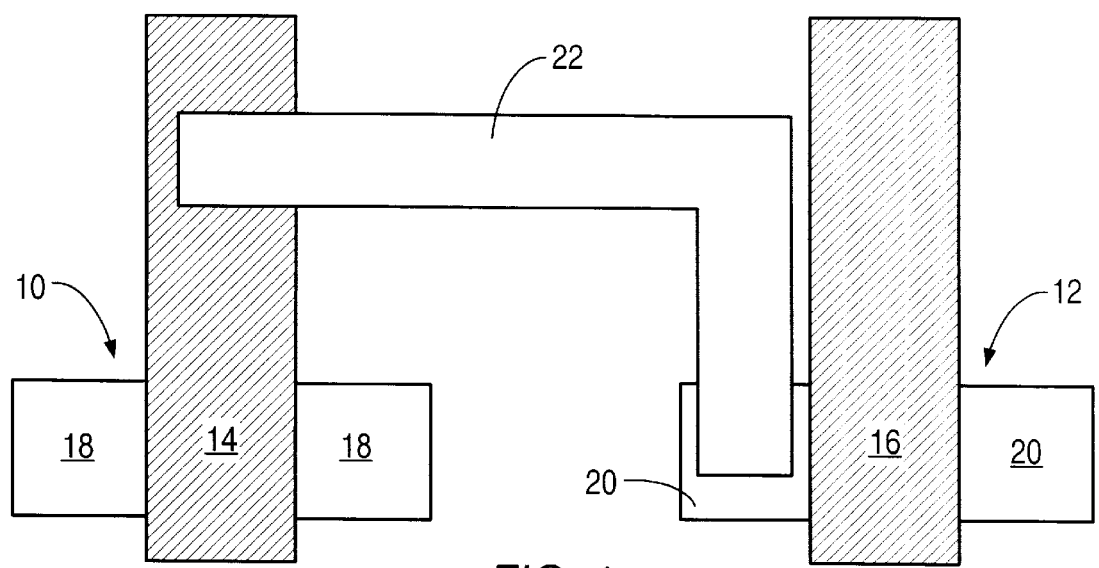
FIG. 1 depicts a top plan view of a semiconductor topography in which the gate conductor of one transistor is coupled to a source/drain region of another transistor using a local interconnect.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2:
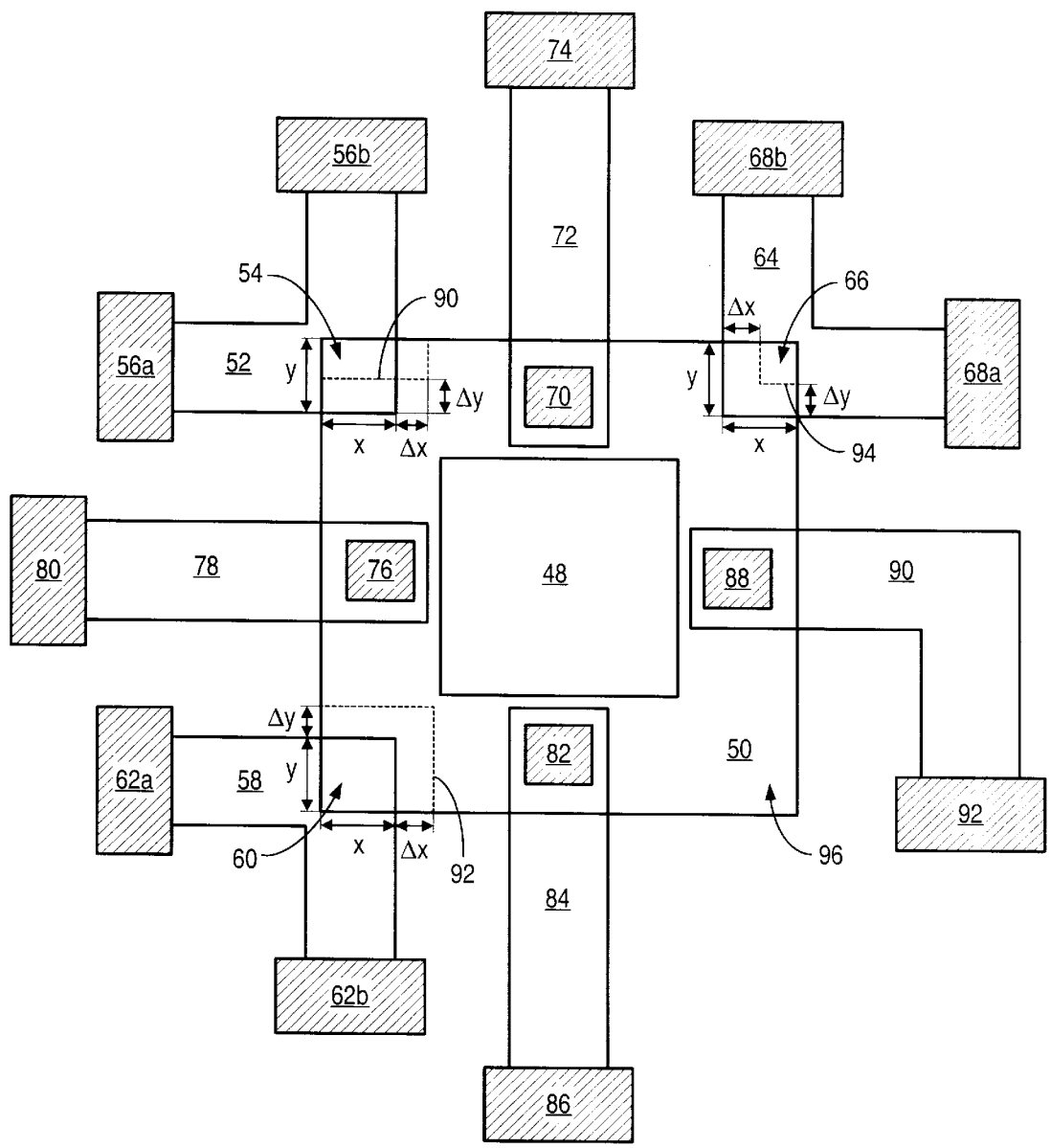
FIG. 2 depicts a top plan view of a test structure from which electrical measurements may be taken to determine the overlay of successive layers of conductors, according to a first embodiment.

FIG. 2 illustrates an embodiment of a test structure which may be used to determine the overlay of successive layers of features employed by an integrated circuit. The test structure may be fabricated upon a production control monitor wafer along with other test structures. Alternatively, the test structure may be formed upon a wafer at the same time as functioning integrated circuit devices are formed upon the wafer. The test structure includes a conductive structure 50 arranged above a semiconductor substrate. Conductive structure 50 may be composed of various semiconductive and conductive materials. Preferably, conductive structure 50 comprises doped polysilicon. Conductive structure 50 is laterally bounded by a dielectric 48. Conductive structure 50 includes first, second, third, and fourth corner regions 54, 60, 66, and 96. Also, conductive structure 50 forms a substantially rectangular shaped loop. As such, conductive structure 50 includes four members which extend between the corner regions of the loop. Contacts 70, 76, 82, and 88 are formed through an interlevel dielectric to each of the members of conductive structure 50. Conductive lines 72, 78, 84, and 90 extend laterally from contacts 70, 76, 82, and 88, respectively, to respective probe pads 74, 80, 86, and 92. The probe pads and the conductive pads are both formed from a conductive material and are sufficiently large to receive conductive probe tips used to send electrical signals to and receive electrical signals from the pads.

Figure 3:
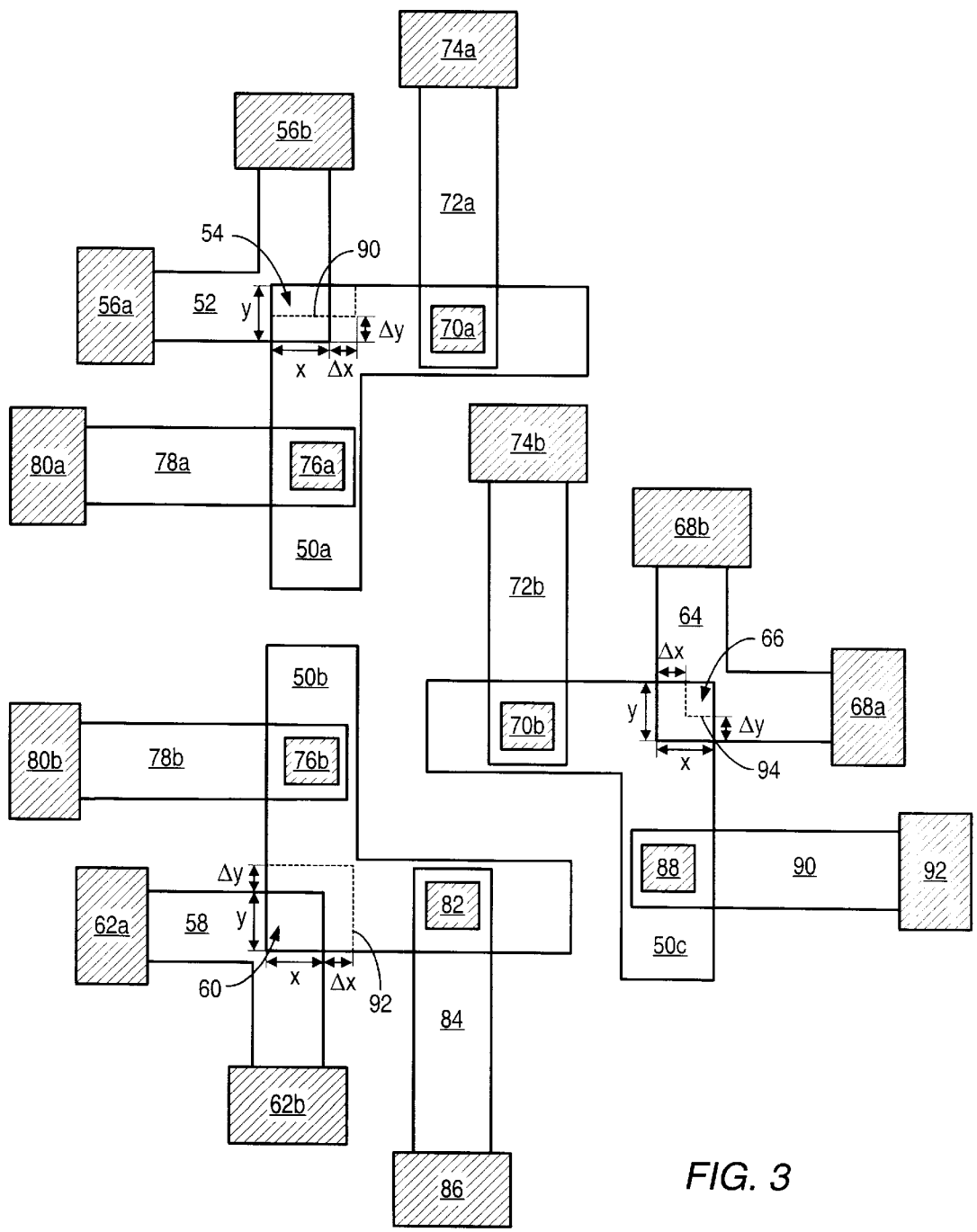
FIG. 3 depicts a top plan view of a test structure from which electrical measurements may be taken to determine the overlay of successive layers of conductors, according to a second embodiment.

FIG. 3 illustrates a more preferred embodiment of a test structure. The test structure includes three conductive structures 50a, 50b, and 50c, rather than a single conductive structure. The three conductive structures are laterally spaced apart by a dielectric. The arrangement of the conductive structures with respect to one another is not limited to the configuration shown in FIG. 3. Conductive structures 50a, 50b, and 50c include respective corner regions 54, 60, and 66. Each conductive structure also includes a pair of members oriented substantially perpendicular to one another. A pair of contacts 70a and 76a are coupled to the pair of members of conductive structure 50a. Conductive lines 728a and 78a extend laterally from respective contacts 70a and 76a to respective probe pads 74a and 80a. Contacts 76b and 82 extend vertically between the members of conductive structure 50b to respective conductive lines 78b and 84. Probe pads 80b and 86 are coupled to respective conductive lines 78b and 84. Also, contacts 70b and 88 are coupled to the pair of members of conductive structure 50c. Conductive lines 72b and 90 extend laterally from respective contacts 70b and 88 to respective probe pads 74b and 92.

According to the embodiments depicted in both FIGS. 2 and 3, first, second, and third conductors 52, 58, and 64 are operably coupled to respective first, second, and third corner regions 54,60, and 66. Conductors 52,58, and 64 may be composed of, e.g., polysilicon or a metal. Overlapping areas of conductors 52,58, and 64 arranged directly above corner regions 54, 60, and 66 are substantially rectangular in shape. In one scenario, conductors 52,58, and 64 are local interconnects that directly corner regions 54,60, and 66, respectively. Alternatively, conductors 52, 58, and 64 may be dielectrically spaced above corner regions 54, 60, and 66, respectively. In this instance, a contact extends vertically through a dielectric from each conductor to the corner region spaced below that conductor. Each conductor includes a pair of arms oriented substantially perpendicular to each other. Conductive pads 56a and 56b are arranged at the end of the arms of conductive structure 52. Conductive pads 62a and 62b are arranged at the end of the arms of conductive structure 58. Also, conductive pads 68a and 68b are positioned at the end of the arms of conductive structure 64.

Dotted lines 90, 92, and 94 depict the outlines of the overlapping areas of conductors 52, 58, and 64, respectively, in the instance that the conductors are misaligned relative to corner regions 54, 60, and 66. The length $\Delta x$ indicates the amount of misalignment in the x-direction, while the length $\Delta y$ indicates the amount of misalignment in the y-direction. Knowing that contact resistance is equivalent to resistivity divided by the contact area, the following equations may be written for each of the misaligned overlapping areas of conductors 52, 58, and 64:

$$(x+\Delta x)(y-\Delta y)=\rho_c/R_1 \qquad\text{(Equation 1)}$$

$$(x+\Delta x)(y+\Delta y)=\rho_c/R_2 \qquad\text{(Equation 2)}$$

$$(x-\Delta x)(y-\Delta Y)=\rho_c/R_3 \qquad\text{(Equation 3)}$$

where $\rho_c$ is the resistivity of the conductor, $R_1$ is the contact resistance between the misaligned overlapping area of conductor 52 and corner region 54, $R_2$ is the contact resistance between the misaligned overlapping area of conductor 58 and corner region 60, and $R_3$ is the contact resistance between the misaligned overlapping area of conductor 64 and corner region 66. By rewritting Equations 1 and 2 above such that only (x+Δx) is on the left side of each equation, the right sides of the equations may be set equal to each other as shown below:

$$(y+\Delta y)(\rho_c/R_1)=(y-\Delta y)(\rho_c/R_2)$$

Solving for Δy, the following equation may be obtained:

$$\Delta y = \frac{y(R_1 - R_2)}{R_1 + R_2}$$

Equations 1 and 3 above may be rewritten such that only (y−Δy) appears on the left side of each equation. As such, the right sides of the equations may be set equal to each other as shown below:

$$(x-\Delta x)(\rho_c/R_1)=(x+\Delta x)(\rho_c/R_3)$$

Solving for Δx, the following equation may be obtained:

$$\Delta x = \frac{x(R_3 - R_1)}{R_1 + R_3}$$

Therefore, the contact resistances of conductors 52, 58, and 64 may be found and substituted into the equations for Δx and Δy to determine misalignment in both the x and y directions.

The contact resistance, $R_1$, between conductor 52 and conductive structure 50 (or 50a) may be found by forcing a current to flow between conductive pad 56a and probe pad 74 (or 74a). Applying a current to conductive pad 56a and grounding probe pad 74 (or 74a) causes the current to flow therebetween. As the current flows between conductive pad 56a and probe pad 74 (or 74a), a high-impedance voltmeter may be used to measure the voltage difference from conductive pad 56b to probe pad 80 (or 80a). Little or no current is allowed to flow between conductive pad 56b and probe pad 80 (or 80a). Therefore, the voltage difference between those pads is approximately equivalent to the voltage drop across the conductor/conductive structure interface. Dividing the voltage difference by the current gives $R_1$. Contact resistances $R_2$ and $R_3$ may be found in a similar manner. That is, current may be forced to flow between conductive pad 62a and probe pad 86, and the voltage difference between conductive pad 62b and probe pad 80 (or 80b) in response to the current flow may be measured to determine $R_2$. Also, current may be forced to flow between conductive pad 68a and probe pad 74 (or 74b), and the voltage difference between conductive pad 68b and probe pad 92 may be measured to determine $R_3$. It is to be understood that conductive lines 78, 72, and 90 are not limited to the configuration shown in FIG. 2. Also, conductive lines 78a, 72a, 78b, 84, 72b, and 90 are not limited to the configuration shown in FIG. 3.

Figure 4:
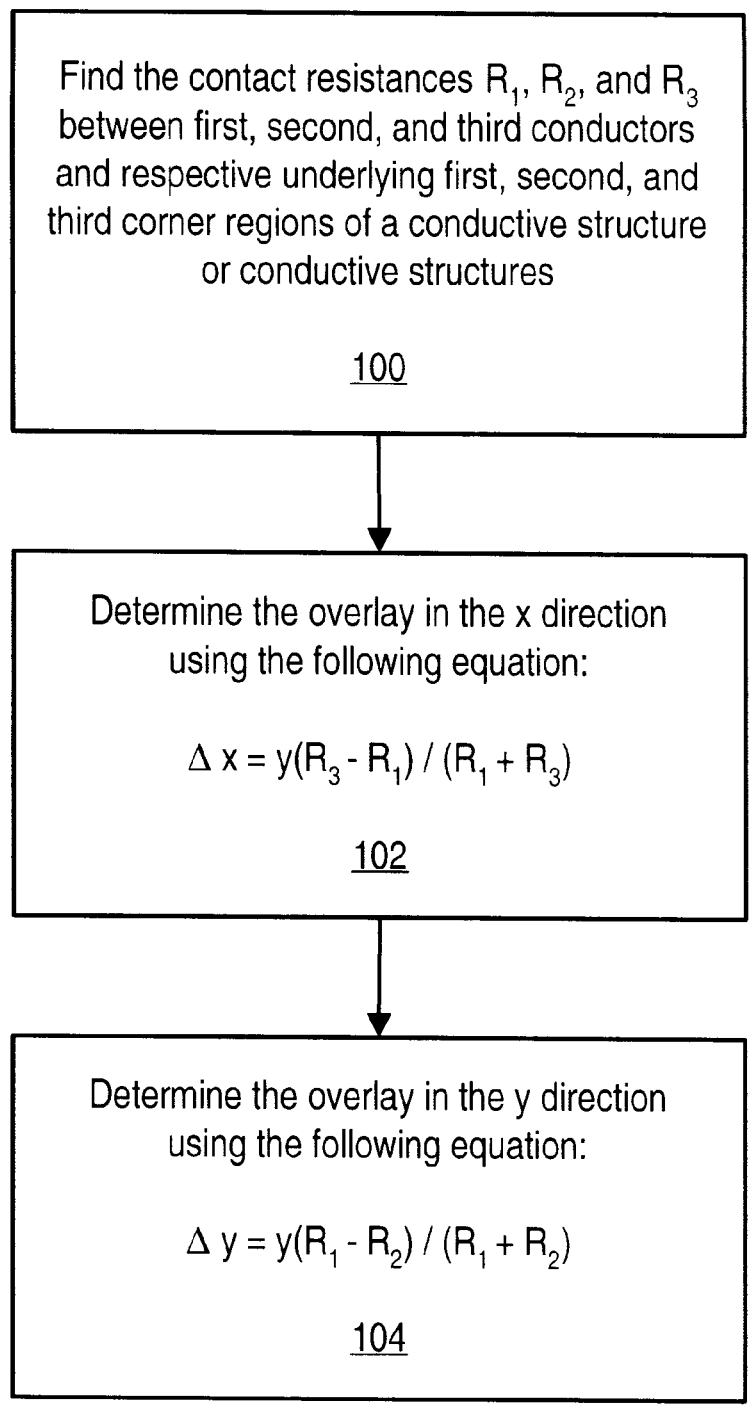
FIG. 4 depicts a process flow diagram of the steps that may be used to determine the overlay in both the x and y directions.

FIG. 4 depicts a simple process flow diagram of the steps that may be employed to determine the overlay between successive layers of patterns formed upon a substrate using the test structures shown in FIGS. 2 and 3. Block 100 shows that the first step is to find the contact resistance between each conductor and the conductive structure residing underneath that conductor. Blocks 102 and 104 show the equations that may be used to determine the overlay in the x direction and the overlay in the y direction based on the contact resistances.

It will be appreciated to those skilled in the art having the benefit of this disclosure that this invention is believed to provide a test structure and method in which electrical measurements are used to determine the overlay between successive layers of conductors. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. An integrated test circuit structure comprising three overlap areas arranged directly between respective overlying conductors and underlying conductors, wherein a corner region of at least one of the underlying conductors is positioned directly below one of the overlap areas, wherein dimensions of the overlap areas are dependent on alignment of the overlying conductors relative to the underlying conductors, wherein an entirety of an upper surface of the corner region is in direct contact with a contact conductor, and wherein the contact conductor comprises a contact extending vertically between the respective underlying conductor and the corresponding overlying conductor.

2. An integrated test circuit structure comprising three overlap areas arranged directly between respective overlying conductors and underlying conductors, wherein a corner region of at least one of the underlying conductors is positioned directly below one of the overlap areas, wherein dimensions of the overlap areas are dependent on alignment of the overlying conductors relative to the underlying conductors, wherein an entirety of an upper surface of the corner region is in direct contact with a contact conductor, wherein the underlying conductors are spaced laterally apart from each other, wherein the underlying conductors are operably coupled to the respective overlying conductors, and wherein each of the overlying conductors comprises a pair of arms configured substantially perpendicular to each other, and further comprising conductive pads connected to each of the pair of arms.

3. An integrated test circuit structure comprising three overlap areas arranged directly between respective overlying conductors and underlying conductors, wherein a corner region of at least one of the underlying conductors is positioned directly below one of the overlap areas, wherein dimensions of the overlap areas are dependent on alignment of the overlying conductors relative to the underlying conductors, wherein an entirety of an upper surface of the corner region is in direct contact with a contact conductor, and wherein the underlying conductors are adjoined such that they form a substantially rectangular loop, and wherein the underlying conductors are operably coupled to the respective overlying conductors.

4. The integrated circuit test structure of claim 3, wherein the underlying conductors directly contact the respective overlying conductors.

5. The integrated circuit test structure of claim 3, further comprising contacts extending vertically between the underlying conductors and the respective overlying conductors.

6. An integrated circuit test structure comprising three overlap areas arranged directly between respective overlying conductors and underlying conductors, wherein the underlying conductors are adjoined such that they form a substantially rectangular loop comprising four corner regions, and wherein dimensions of the overlap areas are dependent on alignment of the overlying conductors relative to the underlying conductors, and, wherein three of the corner regions are positioned directly below the respective overlap areas.

7. The integrated circuit test structure of claim 6, wherein the underlying conductors are operably coupled to the respective overlying conductors.

8. The integrated circuit test structure of claim 6, wherein the rectangular loop comprises four members connecting the four corner regions to each other.

9. The integrated circuit test structure of claim 8, further comprising respective conductive lines operably coupled to the members and extending laterally to respective probe pads.

10. The integrated circuit test structure of claim 6, wherein each of the overlying conductors comprises a pair of arms configured substantially perpendicular to each other, and further comprising conductive pads connected to each of the pair of arms.

11. The integrated circuit of claim 6, wherein the overlap areas are substantially rectangular in shape.

12. The integrated circuit of claim 6, wherein the three corner regions are positioned directly below the respective overlap areas such that they are in electrical communication with the respective overlap areas.

* * * * *

UNITED STATES PATENT AND TRADEMARK OFFICE
CERTIFICATE OF CORRECTION

PATENT NO.    : 6,380,554 B1
DATED         : April 30, 2002
INVENTOR(S)   : Bush et al.

It is certified that error appears in the above-identified patent and that said Letters Patent is hereby corrected as shown below:

Column 8,
Line 29, before the phrase "region is in direct contact" please delete the word "comer" and substitute therefor -- corner --.
Line 59, after the phrase "rectangular loop comprising four" please delete the word "comer" and substitute therefor -- corner --.

Column 9,
Line 3, before the phrase "regions to each other" please delete the word "comer" and substitute therefor -- corner --.

Signed and Sealed this

Twenty-fourth Day of September, 2002

*Attest:*

*Attesting Officer*

JAMES E. ROGAN
*Director of the United States Patent and Trademark Office*